United States Patent [19]
Levin

[11] Patent Number: 4,890,250
[45] Date of Patent: Dec. 26, 1989

[54] HYBRID ESTIMATING FILTER

[76] Inventor: Steven Levin, 3 Woodlawn Dr., Morristown, N.J. 07960

[21] Appl. No.: 273,051

[22] Filed: Nov. 18, 1988

[51] Int. Cl.$^4$ .............................................. H04B 3/04
[52] U.S. Cl. ................................ 364/602; H04B/3/04
[58] Field of Search ............... 364/602, 807, 825, 852, 364/724, 853, 728, 607, 608; 333/18, 28 R, 165, 166; 375/12, 14; 307/106, 227; 328/19, 14, 186, 144

[56] References Cited

U.S. PATENT DOCUMENTS

| | | | |
|---|---|---|---|
| 3,919,649 | 11/1975 | Logeman | 328/186 |
| 4,144,579 | 3/1979 | Nossen | 364/607 |
| 4,322,811 | 3/1982 | Voorman | 364/825 |
| 4,417,317 | 11/1983 | White et al. | 364/825 |
| 4,620,291 | 10/1986 | Vorst | 364/607 |

Primary Examiner—Michael R. Fleming
Attorney, Agent, or Firm—Thomas L. Adams

[57] ABSTRACT

A filter can estimate the signal in an observed input having signal and noise. The filter has a level device and a feedback device. The level device has an input and output terminal for providing on the output terminal a rescaled output variably proportional to the input on the input terminal. This level device can repetitively change the variable proportions between its input and output terminal. The feedback device is coupled between the output and input terminal of the level means for applying to the input terminal an input proportional to the difference between the observed input and the output on the output terminal.

12 Claims, 2 Drawing Sheets

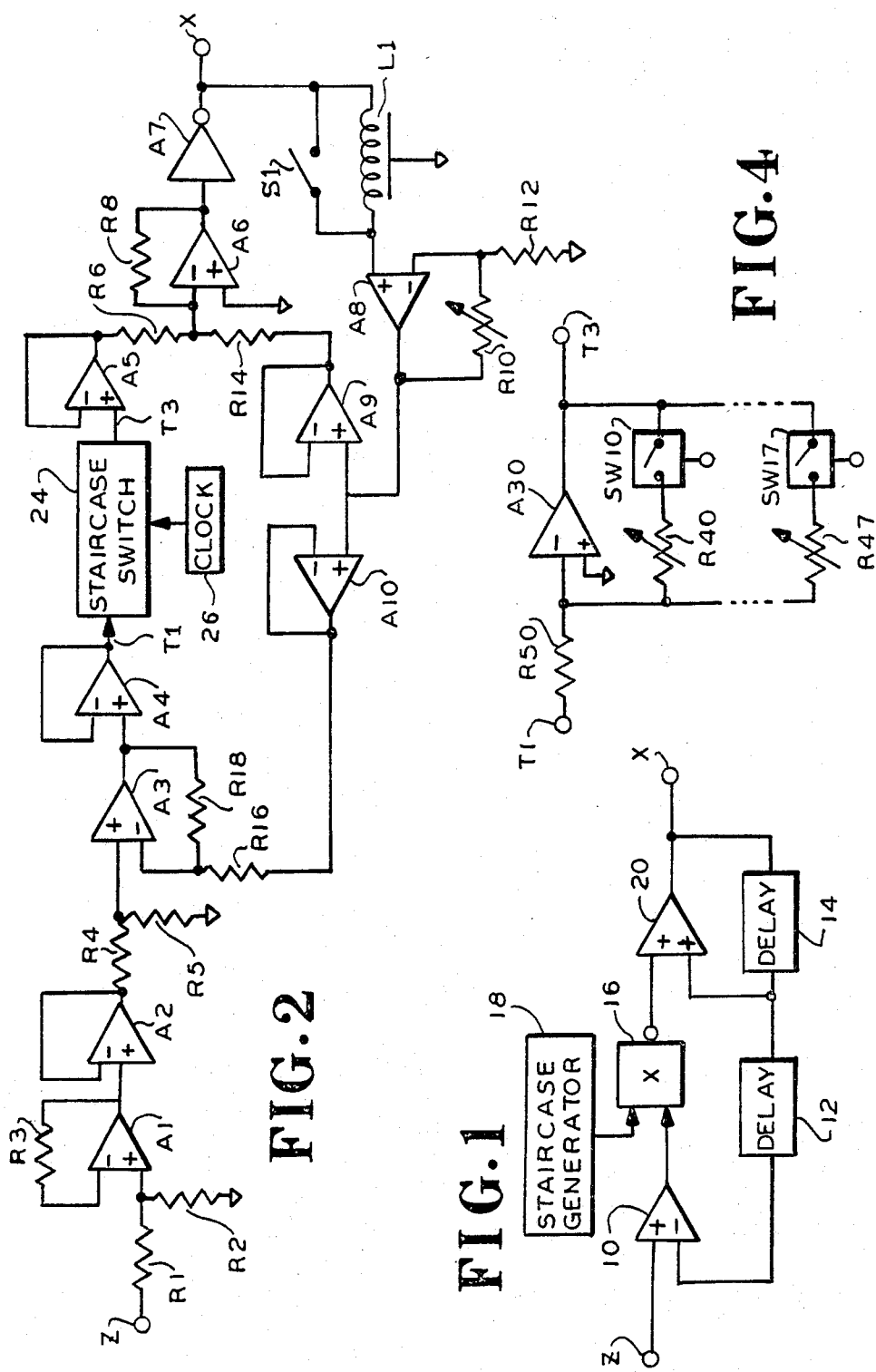

HYBRID ESTIMATING FILTER

BACKGROUND OF THE INVENTION

The present invention relates to hybrid estimating filters and, in particular, to filters employing Kalman filtering techniques and digital and analog circuitry.

Observation of a process may be difficult because of noise of two types: the process itself may experience random disturbances. Secondly, the measurement itself may be subjected to noise that obscures the actual observation.

Well-known estimation methods include least squares estimation and maximum likelihood estimation. In Bayesian estimation, data on previous observations are used to refine an estimate. This technique tends to produce more accurate results but is more difficult to calculate. A stochastic process may be considered a Gauss-Markoff process if its future is independent of its past and its interfering noise is Gaussian.

Kalman filtering techniques employ the Bayesian techniques to provide estimates for a process that is assumed to be Gauss-Markoff. In a Gauss-Markoff process, the state of a process is equal to a process noise plus a prior state vector times a matrix transfer function. In this process, the measurement is obtained in the presence of an interference referred to as process noise.

In a discrete-time Kalman filter, a presumed probability density function is used as a basis for estimating the mean and covariance. As actual observations are obtained, the estimation equations are updated, based upon actual observations. In a continuous time case, the process is often assumed to be represented by a linear differential equation. A result of these assumptions is a filter which has a circuit that simulates the process under observation but has certain of its signals modified in accordance with the density function of the interfering noise.

The disadvantage of performing Kalman filtering digitally is the requirement of a powerful computer for providing real time estimates of the signal contained within a noisy measurement. This clearly increases the complexity and cost of such a filtering system.

A disadvantage with estimates obtained with analog filters is that the accuracy of the estimate is sacrificed in order to provide a real time output.

Staircase generators have been employed to produce sawtooth waves. In U.S. Pat. No. 4,620,291 a sawtooth waveform is generated through a digital to analog converter. Starting digitally, the waveform has many discrete jumps. The discrete signal is applied to a delay line having many taps. The taps are averaged together to provide a relatively smooth waveform. The system is not, however, used for providing a filtered output with Kalman techniques. Other circuitry for involving sawtooth and staircase generators are shown in U.S. Pat. Nos. 3,628,061; 3,676,784; 3,918,046; 3,919,649; and 4,144,579.

Accordingly, there is a need for a filter using estimation techniques that avoids the complexity of a digital Kalman filter without sacrificing.

SUMMARY OF THE INVENTION

In accordance with the illustrative embodiments demonstrating features and advantages of present invention, there is provided a filter for estimating the signal in an observed input having signal and noise. The filter has a level means and a feedback means. The level means has an input and an output terminal for providing on the output terminal a rescaled output variably proportional to the input on the input terminal. This level means is operable to repetitively change the variable proportion between its input and output terminal. The feedback means is coupled between the output and input terminal of the level means. The feedback means can apply to the input terminal an input proportional to the difference between the observed input and the output on the output terminal.

By providing such apparatus an improved estimation can be obtained. In a preferred embodiment, hybrid digital and analog circuitry are used to perform the filtering. Preferably, the filtered output is fed back and subtracted from an input before being applied to a level means. The level means is, in a preferred embodiment, a variable gain stage whose gain is decreased periodically in a stepwise or staircase fashion.

Being thus configured, the filter can process current and prior data to provide a real time estimate. Furthermore, because this analog system operates discretely, advantages of digital and analog techniques are obtained.

In this preferred embodiment, stepped gain is provided through a high-speed counter that sequentially closes one of a plurality of switches. Each of the switches control an adjustable gain amplifier that has been set to account for the expected density function of the noise.

In an optional embodiment, a feedback circuit employs a separate delay line, so that estimates can be performed based upon prior values whose delay are controlled by the delay line.

BRIEF DESCRIPTION OF THE DRAWINGS

Further features and advantages of the present invention will be more fully appreciated by reference to the following detailed description of a presently preferred but nonetheless illustrative embodiment when taken in connection with the accompanying drawings wherein:

FIG. 1 is a schematic block diagram of a filter in accordance with the principles of the present invention;

FIG. 2 is a more detailed block diagram of an embodiment based upon the block diagram of FIG. 1.

FIG. 4 is schematic diagram of a staircase switch circuit that is an alternate to that of FIG. 3.

DETAILED DESCRIPTION OF THE PREFERRED EMBODIMENTS

Figure 3:
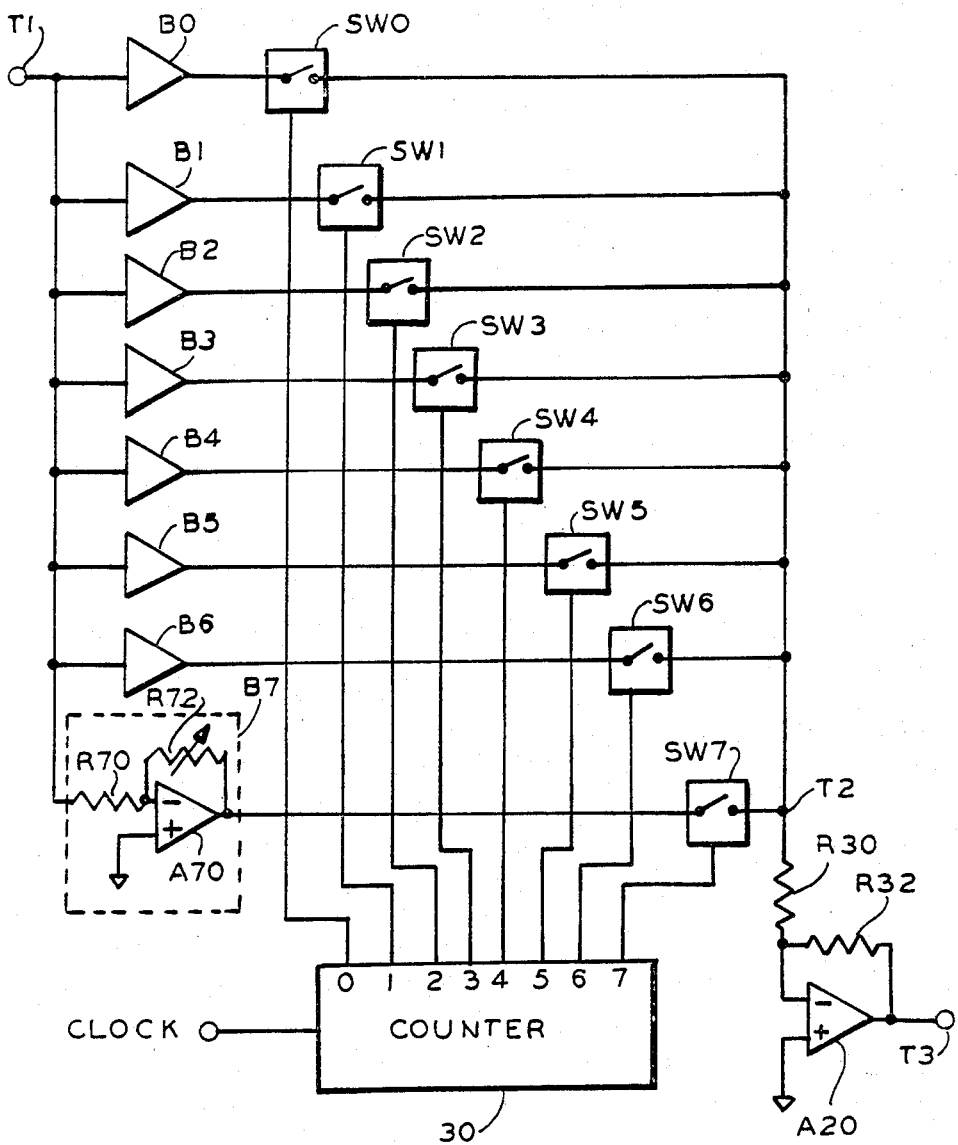
FIG. 3 is a more detailed schematic diagram of the staircase switch of FIG. 2.

Referring to FIG. 1, it shows a filter having an observed input on terminal Z. Terminal Z is connected to the non-inverting input of differential amplifier 10, whose inverting input is connected to the output of delay element 12. The input to delay element 12 is connected to the output of delay element 14, whose input is identified as output terminal X.

The output of differential amplifier 10 is connected to one input of multiplier 16 whose other input is connected to staircase generator 18. Multiplier 16 and staircase generator 18 are referred to herein as a level means. Delay means 12 and 14 are referred to herein as a feedback means.

The output of multiplier 16 is connected to one input of summing amplifier 20 whose other input is connected to the junction between delay elements 12 and 14. The output of summing amplifier 18 is connected to output terminal X.

Referring to FIG. 2, an embodiment of a filter in accordance with FIG. 1 is given in further detail. Previously mentioned input terminal Z is connected to ground through serially connected resistors R1 and R2 whose junction is connected to the non-inverting input of operational amplifier A1 whose inverting input is connected to its output through feedback resistor R3. Thus, amplifier A1 provides a stabilized gain dependent upon the values of resistors R1, R2, and R3 in accordance with well-known circuit principles. The output of amplifier A1 is connected to the non-inverting input of operational amplifier A2, a unity gain buffer whose inverting input is connected to its output directly and to ground through the serial connection of resistors R4 and R5. The junction of resistors R4 and R5 is connected to the non-inverting input of operational amplifier A4, whose output connects to the non-inverting input of amplifier A4.

Amplifier A4 is a unity gain amplifier whose inverting input is connected to its output and the input of a level means shown herein as staircase switch 24. Staircase switch 24, as described further hereinafter provides a variable gain that changes in a sequence timed by the input received from clock 26. Clock 26 operates in the range of 1 to 10 megaHertz, although other frequencies can be employed, depending upon the bandwidth of the signals being processed.

The output of staircase switch 24 is applied to the non-inverting input of unity gain amplifier A5 whose inverting input and output is connected to one terminal of resistor R6 whose other terminal is connected to the inverting input of operational amplifier A6. Its noninverting input is grounded and its inverting input is connected through resistor R8 to its output and the input of unity gain inverter A7. Its output is connected to terminal X. Amplifier A7 and A6 are herein referred to as a buffer means.

A feedback means is shown including a delay means in the form of a delay line L1. Delay line L1 is connected in parallel with switch S1 between terminal X and the non-inverting input of operational amplifier A8, whose output is serially connected to ground through variable resistor R10 and resistor R12. The inverting terminal of amplifier A8 is connected to the junction of resistors R10 and R12.

A return means is shown herein as unity gain amplifier A9 whose non-inverting input is connected to the output of amplifier A8 and whose inverting terminal is connected to its output and to one terminal of resistor R14. The other terminal of resistor R14 is connected to the inverting terminal of amplifier A6.

The feedback means is also shown with a unity gain amplifier A10 having its output connected to its inverting terminal, its non-inverting terminal being connected to the output of amplifier A8. The output of amplifier A10 is serially connected through resistors R16 and R18 to the output of amplifier A3 whose inverting terminal connects to the junction of resistors R16 and R18.

Referring to FIG. 3, the previously mentioned staircase switch is shown employing a sequencing means, shown herein as counter 30, driven by clock input CLOCK. Counter 30 is an integrated circuit which, when sequenced, produces a high signal on one of the eight illustrated outputs. Each of the outputs of counter 30 are connected to a controlling input of one of the eight level switches SW0–SW7.

Adjustable gain amplifiers B0–B7 each have their input connected to terminal T1. The output of each variable gain amplifier B0–B7 is serially connected through switch S0–S7, respectively, to terminal T2. Terminal T2 is connected through resistors R30 and R32 to terminal T3, the output of operational amplifier A20, whose non-inverting terminal is grounded and whose inverting terminal is connected to the junction of resistors R30 and R32.

Each of the amplifiers B0–B7 include the circuitry illustrated in detail for amplifier B7. Specifically, terminal T1 is connected through resistor R70 and variable resistor R72 to the output of operational amplifier A70. The junction of resistors R70 and R72 are connected to the inverting terminal of amplifier A70 whose non-inverting terminal is grounded. Connected in this fashion, the resistor R72 can be adjusted to change the gain of amplifier B7. Thus, the gain between terminal T1 and T2 varies according to the gain established for amplifier B0–B7.

To facilitate an understanding associated with the principles of the foregoing circuitry its operation will now be briefly described. A general review of the Kalman filter equations indicates that a general model for a process is given by $$X_{k+1} = \Phi_k X_k + \Omega_k U_k + \Gamma_k W_k, \quad W_k \approx N(O, Q_k)$$

$$Z_{k+1} = H_{k+1} X_{k+1} + V_{k+1}, \quad V_{k+1} \approx N(O, R_{k+1})$$

wherein X is a state vector, its subscript indicating its rank in a discrete time sequence. Variable U is a forcing function and variable W is process noise, the subscript again indicating its rank in a discrete time sequence. The other coefficients are matrices for manipulating the vector quantities. Vector Z is the observed data and vector V is the measurement noise, again with a subscript indicating its rank in the discrete time sequence. The conventional equations for obtaining the a priori and posterior values in a Kalman filter are as follows:

$$X'_{k+1}(-) = \Phi_k X'_k(+) + \Omega_k U_k$$

$$K_{k+1} = P_{k+1}(-) H^t_{k+1}[H_{k+1} P_{k+1}(-) H^t_{k+1} + R_{k+1}]^{-1}$$

$$P_{k+1}(-) = \Phi_k P_k(+) \Phi^t_k + \Gamma_k Q_k \Gamma^t_k$$

$$P_{k+1}(+) = [I_{n \times n} - K_{k+1} H_{k+1}] P_{k+1}(-)$$

$$X'_{k+1}(+) = X'_{k+1}(-) + K_{k+1}[Z_{k+1} - H_{k+1} X_{k+1}(-)]$$

wherein the apostrophe indicates estimated values and the parenthetical term enclosing a minus or plus indicates a priori and posterior values, respectively. Variable P is the density function and variables Q and R are the covariance of the process and measurement noise, respectively. Variable K is a derived variable.

As will become clear from the following description, the model contemplated by the disclosed circuitry, is simplified and may be represented by the following modified equations:

$$X_{k+1}(-) = X_k$$

$$Z_{k+1}(-) = X_{k+1} + V_{k+1}, \quad V_{k+1} \text{ about} = N(O, R_{k+1})$$

$$X'_{k+1}(-) = X_{k+1}$$

$$K_{k+1} = P_{k+1}(-)/[P_{k+1}(-)+R_{k+1}(-)]$$

$$P_{k+1}(-) = P_k(+)$$

$$P_{k+1}(+) = [1-K_{k+1}]P_{k+1}(-)$$

$$X_{k+1}(+) = X_{k+1}(-) + K_{k+1}[Z_{k+1} - X_{k+1}(-)]$$

Referring to FIG. 2, a noisy signal is applied through amplifiers A1 and A2 to differential amplifier A3. Amplifier A3 receives a feedback signal which is the output signal delayed, either by delay line L1 or if switch S1 is closed, by the delays inherent in amplifiers A8 and A10. The feedback from amplifier A10 is a prior estimate of the signal embedded in the noisy signal of terminal Z. The difference output signal from amplifier A3 is applied through amplifier A4, to staircase switch 24 and amplifier A5.

Referring to FIG. 3, clock 30 sequences counter 30 so that switches SW0, SW1, SW2, SW3, SW4, SW5, SW6, SW7 close in that order for about 1 microsecond (although other closure intervals are contemplated for embodiments using signals of a different bandwidth). Consequently, the output at terminal T2 steps at a 1.0 megaHertz rate. In this embodiment, resistors R72 are adjusted to produce a descending staircase waveform. While eight steps are shown, other embodiments may use a different number. Although clearly other wave shapes including non-monotonic wave shapes may be employed instead. In this embodiment, the gain of each of the amplifiers B0–B7 decreases by a given factor, so that for constant input the output decreases by the same decrement. Thus, if a constant signal were applied to terminal T1, a simple staircase waveform would be produced at terminal T3 with steps occurring at 1 microsecond intervals and the pattern repeating every 8 microseconds.

The staircase-like output of switch 24 (FIG. 2) is applied through amplifier A5 to the summing input of inverting amplifier A6 to be summed with a delayed feedback signal from terminal X. If terminal switch S1 is closed, the delay experienced at the output of amplifier A9 is equal to the delay of that amplifier.

Being configured in this fashion, the circuitry of FIG. 2 performs an estimate based on prior values in accordance with the simplified Kalman filter equations listed above.

In this embodiment the digital circuitry of FIG. 3 has a ground referenced to what would be considered the negative supply of the analog circuitry of FIG. 2. (The analog circuits have a positive and negative supply referenced to its own ground.)

The current driving amplifiers A2, A4, A5, A9 and A10 are optional and may be eliminated in some embodiments.

Referring to FIG. 4, it shows a staircase switching circuitry that operates equivalently to that of FIG. 3. The counter is not shown in this schematic. Instead of separate buffers a single operational amplifier A3 is shown with its output connected to previously mentioned terminal T3, its non-inverting terminal connected to ground, and its inverting terminal connected to one terminal of resistor R50, whose other terminal is connected to previously mentioned terminal T1. Variable resistor R40 and switch SW10 are serially connected between terminal T3 and the inverting terminal of amplifier A30. So are variable resistor R47 and switch SW17. The dotted lines indicate other sets of switches and variable resistors.

Clearly the operation of switches SW10-SW17 steps the gain of amplifier A3. Thus the function of the circuit of FIG. 3 is duplicated.

It will be appreciated that various modifications may be implemented with respect to the above described preferred embodiment. For example, the staircase function can be performed by a separate multiplier circuit. Alternatively, separate feedback paths can be employed so that the feedback delay can be established by separate circuitry. The values of the various components can be altered depending upon the desired output, stability, etc. While operational amplifiers are disclosed, in other embodiments, discrete or more fully integrated circuitry may be used instead. Also, the number of delay elements can be increased so that the estimate can be formed from more prior measurements than illustrated in the disclosed embodiment.

Obviously, many modifications may be made to the above described preferred embodiment and it is therefore to be understood that the disclosed embodiments are exemplary and simply illustrate one manner in which the present invention can be practiced.

WHAT IS CLAIMED IS:

1. A filter for estimating the signal in an observed input having signal and noise, comprising:
   a sequencing clock for providing a clock signal;
   level means having an input terminal and an output terminal for providing on said output terminal a rescaled output being related by a variable proportion to the input on said input terminal, said level means being coupled to said sequencing clock and being operable in response to clock signal to repetitively change the variable proportion said input terminal and said output terminal; and
   feedback means coupled between said output terminal and said input terminal of said level means for applying to said input terminal an input proportional to the difference between the observed input and the output on said output terminal.

2. A filter according to claim 1 wherein said level means comprises:
   buffer means for providing said rescaled output to said output terminal; and
   return means coupled around said buffer means for feeding back to said buffer means said rescaled output.

3. A filter according to claim 2 wherein said level means further comprises:
   a plurality of coupling means for rescaling a signal;
   a plurality of level switches each serially coupled with a corresponding one of said coupling means, each level switch and its corresponding coupling means being coupled in parallel between said input terminal and said output terminal of said level means; and
   sequencing means coupled to said sequencing clock for repetitively and sequentially closing one of said level switches in response to said clock signal.

4. A filter according to claim 3 wherein the signal in said observed input has a predetermined bandwidth, said sequencing means sequencing at a frequency exceedingly beyond the bandwidth of the signal in said observed input.

5. A filter according to claim 4 wherein said feedback means provides negative feedback.

6. A filter according to claim 5 wherein said return means provides positive feedback.

7. A filter according to claim 5 wherein said feedback means includes:

delay means coupled to said output terminal of said level means for feeding back to its input terminal a delayed representation of said rescaled output.

8. A filter according to claim 7 wherein said return means and said feedback means are both serially coupled to said delay means, so that both carry a delayed representation of said rescaled output.

9. A filter according to claim 7 wherein the period of sequencing of said sequencing means is within an of order of magnitude of the delay of said delay means.

10. A filter according to claim 4 wherein said level means is operable to sequentially rescale by a factor that periodically and discretely changes in a given direction a predetermined number of times before repeating.

11. A filter according to claim 10 wherein said given direction of said factor of said level means causes said rescaled signal to decrease in magnitude by a plurality of steps.

12. A filter according to claim 3 wherein said coupling means comprises:

a variable resistance for adjusting the transfer function of said coupling means.

* * * * *